United States Patent [19]
Warren

[11] Patent Number: 5,094,969
[45] Date of Patent: Mar. 10, 1992

[54] METHOD FOR MAKING A STACKABLE MULTILAYER SUBSTRATE FOR MOUNTING INTEGRATED CIRCUITS

[75] Inventor: Keith O. Warren, Newbury Park, Calif.

[73] Assignee: Litton Systems, Inc., Woodland Hills, Calif.

[21] Appl. No.: 594,373

[22] Filed: Oct. 9, 1990

Related U.S. Application Data

[62] Division of Ser. No. 407,045, Sep. 14, 1989, Pat. No. 5,006,923.

[51] Int. Cl.$^5$ .................. H01L 21/84; H01L 21/90; H01L 21/52; H01L 21/56
[52] U.S. Cl. .................................. 437/51; 437/208; 437/213; 437/218; 437/219; 437/915
[58] Field of Search ............... 437/208, 213, 218, 219, 437/915, 927, 51; 357/71; 29/830, 831, 832

[56] References Cited

U.S. PATENT DOCUMENTS

| | | | |
|---|---|---|---|
| 4,417,392 | 11/1983 | Ibrahim et al. | 29/830 |
| 4,640,010 | 2/1987 | Brown | 357/81 |
| 4,682,414 | 7/1987 | Butt | 29/832 |
| 4,899,118 | 2/1990 | Polinski, Sr | 361/414 |
| 4,967,201 | 10/1990 | Rich, III | 342/175 |

FOREIGN PATENT DOCUMENTS

| | | | |
|---|---|---|---|
| 56-126947 | 10/1981 | Japan | 437/218 |
| 62-214648 | 9/1987 | Japan | 437/218 |

OTHER PUBLICATIONS

"IBM Technical Disclosure Bulletin"; vol. 27, No. 6, Nov., 1984 L. S. Goldmann.
Suss Report, Sep. 1988, p. 3 Rogers, Microtec Multichip Modules, A New Generation in Interconnection Technology.
H. C. Bhedwar, et al., *Hybrid Circuit Technology*, Low Temperature Cofireable Ceramic System with Buried Resistors and Post-Fired Metallization, May 1989, p. 31.
Corning Applications Information, Sealing Glass Corning Code 7585, issued Jun. 24, 1980.
Corning Applications Information, Sealing Glass Corning Code 7589, issued Feb., 1981.

Primary Examiner—Olik Chaudhuri
Assistant Examiner—David E. Graybill
Attorney, Agent, or Firm—Poms, Smith, Lande & Rose

[57] ABSTRACT

A substrate is formed from a core substrate of flexible, low-temeprature co-fireable ceramic tape and an outer substrate of ceramic tape having apertures for receiving integrated circuits (ICs) therein. The substrate is heated the form a rigid body which then mounts the ICs. The rigid body and ICs are covered or at least partially covered with an insulating glass and heated to a temperature that fuses the glass but does not harm the ICs. The resulting structure hermetically seals the ICs in a single substrate that is insensitive to acceleration forces.

9 Claims, 1 Drawing Sheet 5,094,969

METHOD FOR MAKING A STACKABLE MULTILAYER SUBSTRATE FOR MOUNTING INTEGRATED CIRCUITS

This invention was made with Government support under Contract No. DAAA21-87-C-0019 awarded by the Department of the Army. The Government has certain rights in this invention.

This is a divisional of application Ser. No. 407,045, filed on Sept. 14, 1989, now U.S. Pat. No. 5,006,923.

BACKGROUND OF THE INVENTION

1. Field of the Invention

The present invention relates to a stackable multilayer substrate and, more particularly, to a substrate that mounts integrated circuits (ICs) thereon so that the integrated circuits are impervious to high acceleration forces and atmospheric conditions.

2. Description of the Prior Art

It is well-known in the prior art to utilize a thin-film structure that can be formed from multilayers of low-temperature co-fireable ceramic tape with power and ground connections between the multilayers. The so-called co-fireable ceramic tape is a flexible substrate before heating manufactured by various companies including DuPont who sells its product under the trademark Green Tape. The thin and flexible material becomes rigid after it is subjected to heat as by firing in an oven. DuPont and other companies market this material for high-density packages of ICs with conductive layers sputtered onto the multilayers of the ceramic tape before its firing.

SUMMARY OF THE INVENTION

It is an object of the present invention to utilize the known capabilities of the low-temperature co-fireable ceramic tape to form a substrate for mounting integrated circuits that will enable the circuits to withstand high acceleration forces and severe atmospheric conditions applied thereto.

It is another object of the present invention to eliminate the need for mechanical metal packaging usually associated with integrated circuits.

In accomplishing these and other objects there is provided a first substrate formed from multilayers of low-temperature co-fireable ceramic tape which acts as a core upon which the integrated circuits (ICs) may be mounted. Conductive paths and pads may be sputtered or screen printed upon the multilayers and conductive vias may be mounted in through holes therein to carry electrical signals from one layer to the other. On one or both sides of the core are outer layers of ceramic tape which may be provided with apertures therein for receiving the integrated circuits. The outer layers may also be screen printed to form conductive paths and pads for the ICs mounted within the apertures therein. After the core layer and its component receiving, outer layer or layers are formed, the resulting substrate is fired to create a rigid multilayer circuit board.

Thereafter, the rigid multilayer circuit board may be assembled by mounting appropriate ICs into the apertures formed within the outer layers of the multilayer board. Each individual rigid multilayer printed circuit board is then coated with a non-conductive sealing glass frit to cover or at least partially cover the ICs Several rigid multilayer circuit boards may then be joined together in a stack with the ICs mounted therebetween. The stack of multilayer boards may be joined by heating the non-conductive glass coated upon their surfaces. The ICs may be electrically connected between the stacked boards by forming isolated areas of the non-conductive glass into conductive frits. Thereafter, the stacked, sandwiched assembly is fired at a temperature high enough to fuse the glass but low enough so as not to damage the ICs. The resulting package is a rigid package with firmly mounted ICs encased in the fired non-conductive glass to form an electronic package that is unaffected by high acceleration forces and is hermetically sealed.

DESCRIPTION OF THE DRAWINGS

A better understanding of the invention will be had after consideration of the following specification and drawings, wherein.

DESCRIPTION OF THE PREFERRED EMBODIMENT

Figure 1:
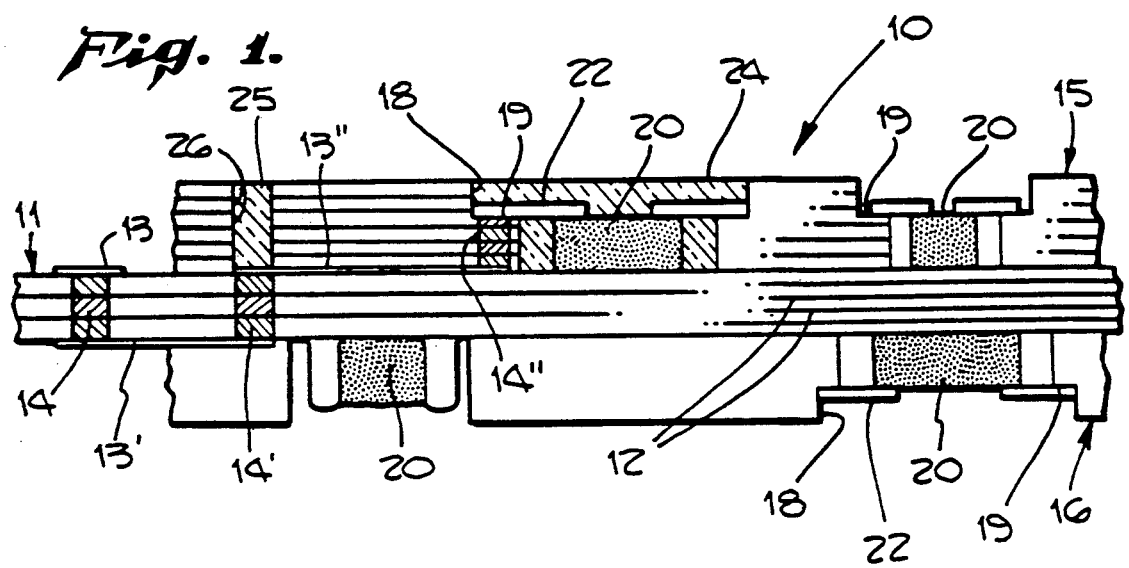
FIG. 1 is a cross-sectional view showing a typical single co-fired substrate of the present invention.

Referring now to the drawings, FIG. 1 shows a cross-sectional view of a typical multilayer substrate 10 having a core 11 formed from three, five, or more layers of low-temperature co-fireable ceramic tape substrate 12 that are flexible before firing. Such tape is manufactured by DuPont Electronics under the trademark Green Tape. On one or both sides or in between the multilayers of ceramic tape 12 are various patterns of electrically conductive paths 13, 13', 13" which may be deposited by known techniques, such as screen printing or vacuum sputtering. Joining the various layers of ceramic tape 12 are a plurality of vias 14, 14', 14" formed by small plugs of conductive material, such as gold or conductive glass, which may be screen printed into through holes formed in the layers of tape 12. On one or both sides of the core 11 of the multilayers of tape 12 are second substrates formed by outer multilayers of ceramic tape 15 and 16 provided with apertures 18 therein, as by a punch process. The multilayers that form substrates 15 and 16 are stacked to form apertures 18 therein with step-like shoulders 19 for mounting suitable ICs 20. It will be seen in FIG. 1 that the ICs 20 have electrically conductive leads 22 which are aligned with the steps 19 of apertures 18. Suitable conductive paths and pads, not shown, may also be mounted on steps 19 to receive the leads 22.

After the multiple layers 11, 15 and 16 of the co-fireable ceramic tape are formed but before the ICs are inserted, the assembly may be fired in an air atmosphere in an oven at about 850° C. plus or minus about 50° C. for forming all layers into a rigid multilayer circuit board. While layers 11, 15 and 16 are shown in a plane, it will be understood that they may also be shaped into non-planar configurations. After the layers 11, 15 and 16 are formed into the rigid board, the ICs 20 are inserted into apertures 18 and their leads 22 attached to appropriate conductive paths or pads 13, 13', 13" or vias 14 on the steps 19 of apertures 18, as by soldering or spot welding. Before and after the assembly of the ICs 20, the rigid multilayer circuit board may be cleaned in an $O_2$ atmosphere, for example.

Thereafter, the rigid substrate 10 may be coated by screen printing with a suitable non-conductive sealing glass frit 24 which covers or at least partially covers the ICs 20 and fills or partially fills the apertures 18, only one of which is shown in FIG. 1. The sealing glass frit may be one of several kinds including, but not limited to, sealing glass manufactured by Corning Glass Works as its sealing glass, Corning Codes 7585 or 7589. The ICs need only be partially covered when concerned with high acceleration forces upon the IC leads 22. Here, the sealing glass frit need only cover the leads 22. In other applications, it may be necessary to fully cover the structure of the ICs.

The glass frit which covers or partially covers the IC leads can be formed from several layers of glass or formed from a single layer. Further, the glass can be selected to have a density and coefficient of thermal expansion close to that of the silicon material of the ICs. The non-conductive glass frit may be made conductive in certain isolated areas by silver loading the non-conductive glass with, for example, Amicon CG-932-4D silver/glass conductive adhesive, as shown in FIG. 1 at 25. In this way, certain areas of the surface of the single substrate 10 may be made conductive by the presence of the conductive glass frits 25 to electrically join one single substrate to another, as discussed below.

FIG. 1 shows, by way of example, a wiring circuit formed by a via 14 which passes through the layers 12 of core substrate 11 from a pad 13 to a conductive path 13' and then to a second via 14'. The conductive path 13' could connect to a lead, not shown, on the IC 20 shown on the lower, left-hand surface of core 11. The conductor 13' also connects through the second via 14' to a second conductive path 13" to a third via 14" and then to the lead 22 of the IC 20 on the upper, left-hand surface of core 11. In the example shown, a conductive glass frit 25 flows into apertures 26 in the outer layers 15 to electrically connect the outer surface of the substrate 10 to the wiring circuit just described. It will be understood that the non-conductive glass frit 24 may be flowed or screen printed over the full outer surface of substrate 10 using, for example, 80 mesh stainless steel screen and 100 mesh frit.

To complete the assembly of the single substrate 10 of FIG. 1, the substrate and its non-conductive and conductive frits 24 and 25, respectively, are placed in a conventional oven in an air atmosphere and heated to about 380° C. for the Corning 7585 sealing glass or to about 480° C. for the Corning 7589 sealing glass. These temperatures are hot enough to melt the glass and yet low enough so as not to harm the ICs 20.

Figure 2:
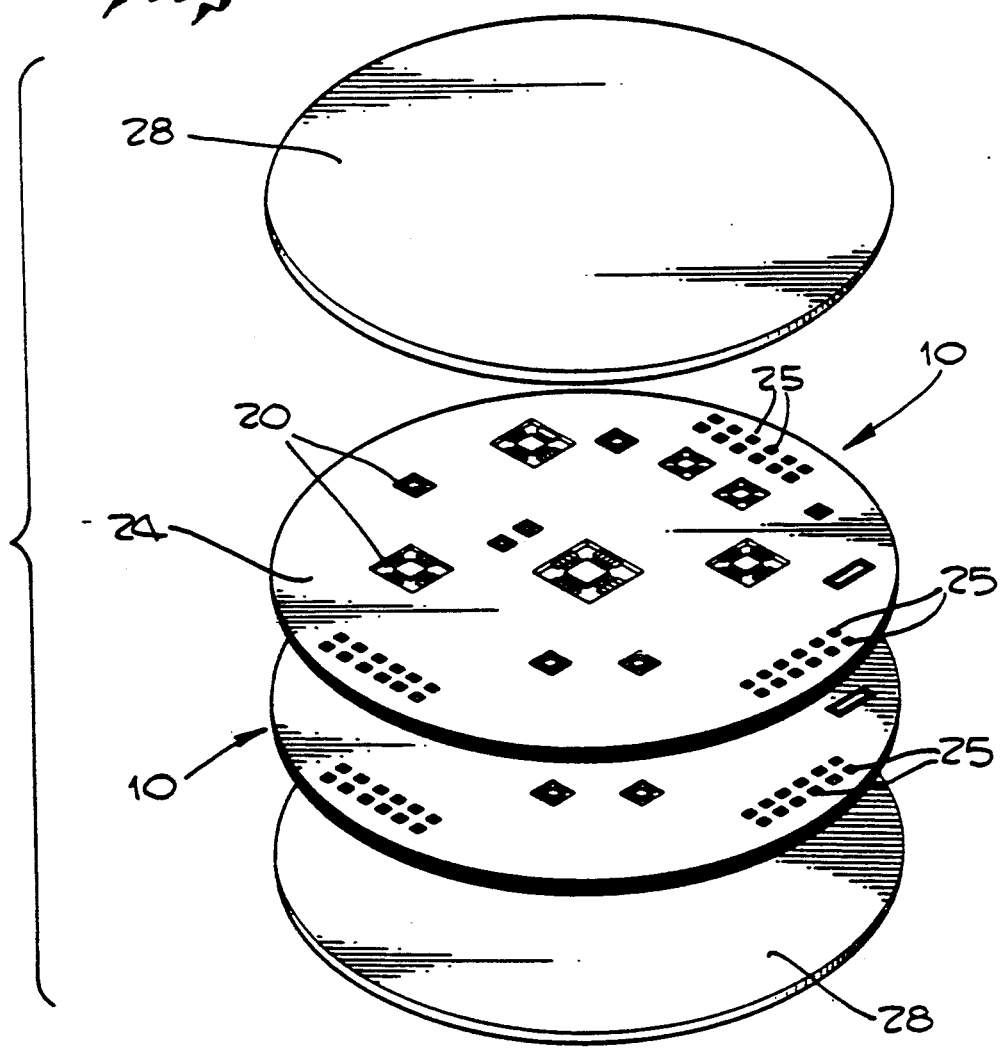
FIG. 2 is a perspective view showing several single co-fired substrates in a preassembly configuration before stacking.

As shown in FIG. 2, a plurality of individual substrates 10 may be stacked upon each other to form a sandwiched construction. The stack is arranged with non-conductive sealing glass 24 covering the outer surfaces of substrates 10 and conductive glass frits 25 at appropriate isolated areas in the surfaces of the substrates in contact one with the other.

Thereafter, the sandwiched assembly may be fired again at a temperature high enough to melt the glass but low enough to prevent damage to the ICs 20. In the preferred embodiment, the temperature is about 380° C. for Corning 7585 sealing glass and 480° C. for Corning 7589 sealing glass. The non-conductive glass 24 thus seals the package into a rigid structure while the conductive glass 25 creates electrical contacts between the individual substrate 10.

The resulting structure of multistacked substrates 10 is rigid and highly resistant to accelerational forces. Further, the resulting structure hermetically seals the ICs 20 and eliminates the need for machined metal packages normally associated with the ICs 20.

As seen in FIG. 2, the assembly may be completed through the use of appropriate covers 28 which may be joined to the sandwiched stack of substrates 10 using the same non-conductive glass 24 used to seal the ICs in their apertures 18.

I claim:

1. A method of manufacturing a substrate for mounting integrated circuits in a multistack configuration, comprising the steps of:

forming a first core substrate from a plurality of insulated layers that are flexible until heated;

forming a second outer substrate against said first substrate from a plurality of insulated layers that are flexible until heated having a plurality of apertures therein which are aligned to form integrated circuit receiving apertures, including a plurality of successive adjacent layers having aligned apertures;

heating said first and second substrates into a single, rigid substrate;

placing integrated circuits into said apertures in said second outer substrate, said integrated circuits having a thickness greater than the thickness of individual ones of said insulated layers;

placing a layer of heat setting insulating material at least partially over said integrated circuits in said apertures;

heating said insulating material and said single, rigid substrate and integrated circuits to mount said integrated circuits rigidly upon said rigid substrate;

placing an additional layer of heat setting insulating material over the surface of said rigid substrate;

placing two or more of said rigid substrates into a stack; and heating said insulating material and said two or more rigid substrates and integrated circuits to a temperature hot enough to melt said heat setting insulating material but not hot enough to melt said two or more substrates or to harm said integrated circuits to mount said circuits in said multistack configuration.

2. The method of claim 1, wherein:

said step of heating of said first and second substrates is carried out at about 850° C. plus or minus about 50° C.; and said steps of heating of said insulating material are carried out at about 380° C. and 480° C.

3. The method of claim 1, wherein:

the step of placing a layer of heat setting insulating material over said integrated circuits includes placing said heat setting insulating material in said apertures to cover said circuits and to fill said apertures.

4. A method of manufacturing a substrate for mounting integrated circuits in a multistack configuration, comprising the steps of:

forming a first core substrate from a plurality of insulated layers that are flexible until heated;

forming second and third outer substrates against said first substrate on both sides of said substrate from a plurality of insulated layers that are flexible until heated having a plurality of apertures therein which are aligned to form integrated circuit receiving apertures;

heating said first, second and third substrates into a single, rigid substrate;

placing integrated circuits into said apertures in said second and third outer substrates;

placing a layer of heat setting insulating material at least partially over said integrated circuits in said apertures;

heating said insulating material and said single, rigid substrate and integrated circuits to mount said integrated circuits rigidly upon said rigid substrate;

placing an additional layer of heat setting insulating material over the surface of said rigid substrate;

placing two or more of said rigid substrates into a stack; and heating said insulating material and said two or more rigid substrates and integrated circuits to a temperature hot enough to melt said heat setting insulating material but not hot enough to melt said two or more substrates or to harm said integrated circuits to mount said circuits in said multistack configuration.

5. A method as defined in claim 1 wherein the heat setting insulating material is glass frit and the heating steps include the melting of the glass frit so that it bonds with adjacent portions of the multistack configuration.

6. A method as defined in claim 1 wherein:
the uppermost one of said additional layers of heat setting insulating material comprises a cover over said multistack configuration of integrated circuits.

7. A method as defined in claim 1 wherein:
said single rigid substrate further comprises conductive frit formed from conductive material for electrically joining one substrate within said multistack configuration to another.

8. A method as defined in claim 4 wherein:
the uppermost one of said additional layers of heat setting insulating material comprises a cover over said multistack configuration of integrated circuits.

9. A method as defined in claim 4 wherein:
said single rigid substrate further comprises conductive frit formed from conductive material for electrically joining one substrate within said multistack configuration to another.

* * * * *